(12) United States Patent
Chang et al.

(10) Patent No.: US 9,316,704 B2
(45) Date of Patent: Apr. 19, 2016

(54) MAGNETIC SENSOR AND FORMING METHOD

(71) Applicant: Taiwan Semiconductor Manufacturing Co., Ltd., Hsin-Chu (TW)

(72) Inventors: Kuei-Sung Chang, Kaohsiung (TW); Chun-Wen Cheng, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/463,814

(22) Filed: Aug. 20, 2014

(65) Prior Publication Data

US 2016/0054401 A1 Feb. 25, 2016

(51) Int. Cl.
| | |
|---|---|
| H01L 29/82 | (2006.01) |
| G01R 33/06 | (2006.01) |
| H01L 21/02 | (2006.01) |
| H01L 43/00 | (2006.01) |
| H01L 43/12 | (2006.01) |

(52) U.S. Cl.
CPC .......... *G01R 33/06* (2013.01); *H01L 21/02104* (2013.01); *H01L 43/00* (2013.01); *H01L 43/12* (2013.01)

(58) Field of Classification Search
CPC ......... H01L 29/82; H01L 27/72; H01L 23/12; H01L 43/065
USPC .................................................. 257/427, 704
See application file for complete search history.

(56) References Cited

U.S. PATENT DOCUMENTS

| | | | |
|---|---|---|---|
| 9,105,568 B2 * | 8/2015 | Iuliano et al. | |
| 2011/0074011 A1 * | 3/2011 | Shi et al. ....................... | 257/723 |
| 2012/0086945 A1 * | 4/2012 | Hirokubo et al. ............. | 356/450 |
| 2014/0335301 A1 * | 11/2014 | Van 'T Oever et al. ......... | 428/76 |

OTHER PUBLICATIONS

Gatzen, H.H. Magnetic Materials in Thin Film Sensors and Actuators. Eighth International Symposium on Magnetic, Materials, Processes, and Devices. Oct. 5, 2004.

* cited by examiner

*Primary Examiner* — Phuc Dang
(74) *Attorney, Agent, or Firm* — Eschweiler & Associates, LLC

(57) ABSTRACT

The present disclosure relates to a MEMS device with a magnetic film disposed on a first substrate, and an associated method of formation. In some embodiments, the magnetic film is disposed on a planar front surface of the first substrate such that depositing and patterning processes of the magnetic film is improved. A sensing gap of a MEMS device associated with the magnetic film is located between the magnetic film and a recessed lateral surface of a second substrate. The second substrate is bonded to the first substrate at front surfaces of the first and second substrate. Forming the magnetic film on the planar front allows for patterning of the magnetic film without leaving unwanted residues of magnetic material. Without the unwanted residue of magnetic material, less contamination from the magnetic material is introduced after dry etching and passivation processes, improving yield and reliability of the MEMS device.

20 Claims, 7 Drawing Sheets

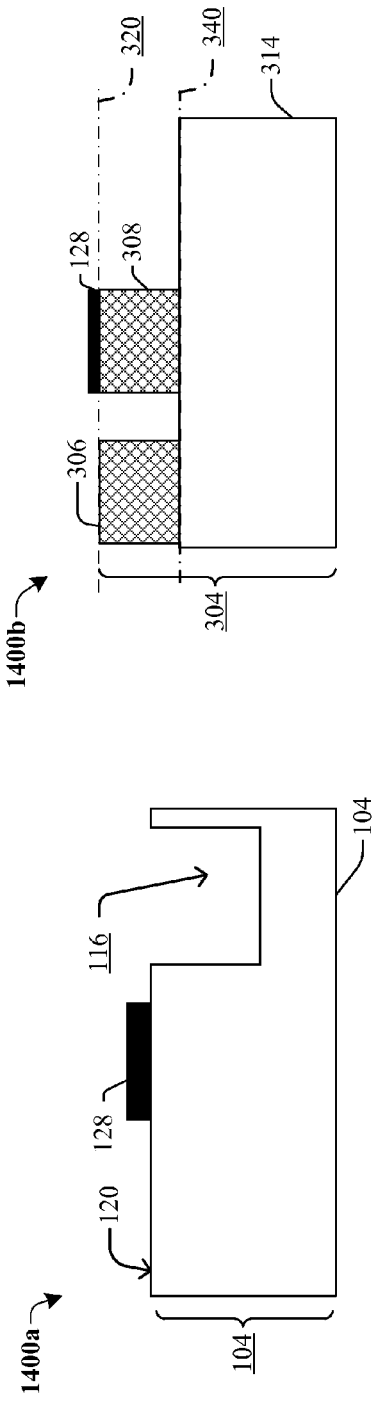
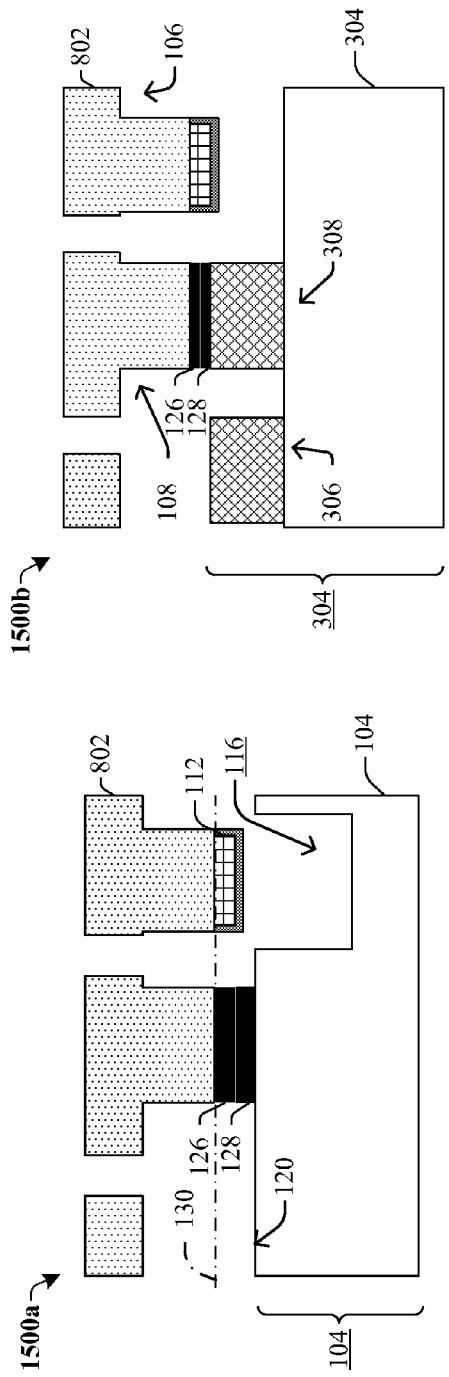
Fig. 14B
Fig. 15B
Fig. 14A
Fig. 15A

MAGNETIC SENSOR AND FORMING METHOD

BACKGROUND

MEMS (micro-electromechanical system) devices, such as accelerometers, pressure sensors, gyroscopes, etc., have found widespread using in many modern day electronic devices. For example, MEMS accelerometers are commonly found in automobiles (e.g., in airbag deployment systems), tablet computers, or in smart phones.

BRIEF DESCRIPTION OF THE DRAWINGS

Aspects of the present disclosure are best understood from the following detailed descriptions when read with the accompanying figures. It is noted that, in accordance with the standard practice in the industry, various features are not drawn to scale. In fact, the dimensions of the various features may be arbitrarily increased or reduced for clarity of discussion.

FIGS. 8-15B illustrate some embodiments of cross-sectional views showing a method of forming a MEMS device having a magnetic film disposed on a substrate.

DETAILED DESCRIPTION

Figure 1:
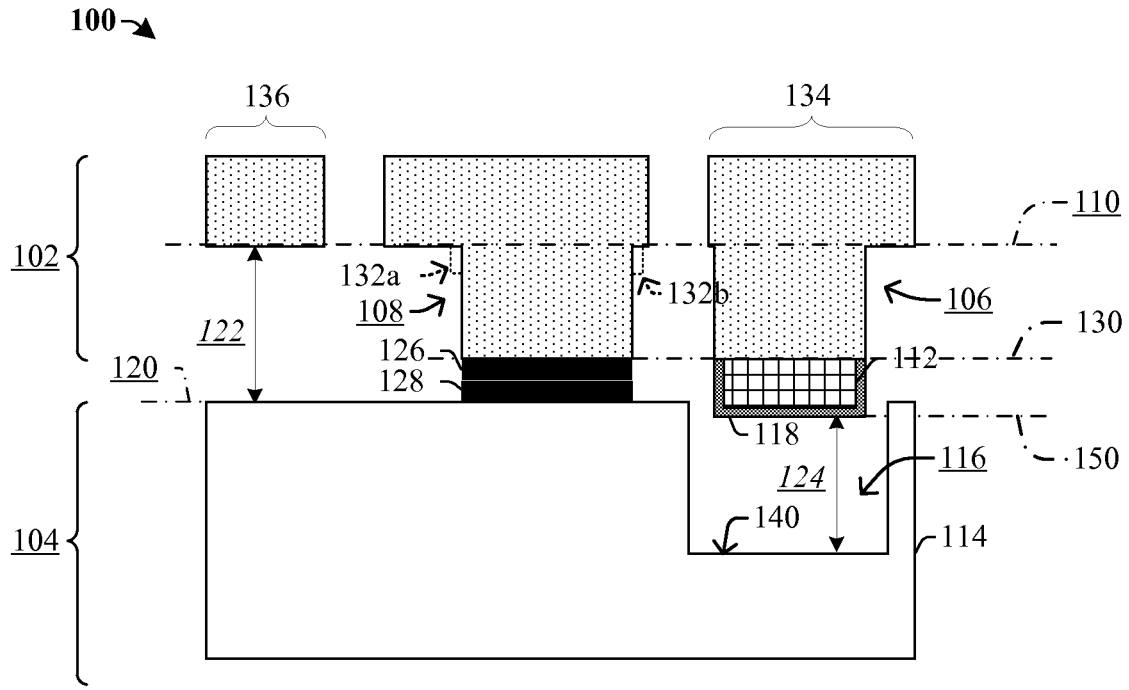
FIGS. 1-5 illustrate cross-sectional views of some embodiments of a MEMS device having a magnetic film disposed on a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some applications, MEMS devices can be incorporate into integrated chips formed by a complementary metal-oxide-semiconductor (CMOS) process. The incorporation of MEMS devices (e.g., sensors, integrated optics, biochips, etc.) into a CMOS process allows for widespread use of MEMS fabricated with a high throughput. In addition, multiple different MEMS sensor devices may be integrated in a single wafer. For example, magnetic field sensors can be integrated with other MEMS sensor devices, such as accelerometers, pressure sensors, and gyroscopes etc. Among these MEMS sensor devices, some use precision gaps between a sensor substrate and a counter substrate to define sensing gaps. Conventionally, sensing gaps of MEMS sensor devices are formed between a recessed lateral surface of a sensor substrate and a planar front surface of a counter substrate. The recessed lateral surface can be achieved by performing a dry etching process on a planar front surface of the sensor substrate. The front surfaces of the sensor substrate and the counter substrate can then be bonded together by various bonding techniques, such as direct bonding or eutectic bonding, to form a sensing gap between the recessed surface of the sensor substrate and the planar flat surface of the counter substrate.

To integrate a magnetic field sensor with other types of MEMS sensor devices, a magnetic film needs to be formed on the sensor substrate at a position corresponding to a first sensing gap, while a different MEMS device may need a second sensing gap. The magnetic film is often formed by forming a conformal layer of magnetic material onto a recessed lateral surface of a sensor substrate, followed by patterning the magnetic material layer using a dry etching process. However, magnetic material around corners of topographies extending outward from the recessed lateral surface is difficult to remove, resulting in residues of magnetic material left around those corners after performing the dry etching process. The magnetic material is often a significant contamination for the fabrication processes and may damage the circuits due to metal ions. This contamination can affect reliability, reduce manufacturing yields, and render some circuits unusable or less than optimal. Further, the patterned magnetic film needs to be protected by forming a passivation film in a subsequent process. However, the non-planar topography of the sensor substrate has a negative effect on forming a well-controlled, precise passivation film around the magnetic film.

The present disclosure relates to a MEMS device with a magnetic film disposed on a front surface of a sensor substrate that is bonded to a front surface of a counter substrate, and an associated method of formation. In some embodiments, the sensor substrate has a first protrusion and a second protrusion extending outward from a lateral surface of the first substrate. The magnetic film is disposed on the first protrusion. The counter substrate is bonded to the second protrusion. The magnetic film is separated from the counter substrate by a first sensing gap. By forming the magnetic film on a planar front surface of the sensor substrate, patterning of the magnetic film is easier and well-controlled, thereby eliminating unwanted residues of magnetic material. Without the unwanted residue of magnetic material, less contamination from the magnetic material is introduced after dry etching and passivation processes. Therefore, the resultant MEMS device can be manufactured with higher yield and better reliability than previous approaches.

FIG. 1 illustrates a cross-sectional view of a MEMS device 100 according to some embodiments. The MEMS device 100 comprises a first substrate 102 bonded to a second substrate 104 by first and second bonding elements 126 and 128. The first substrate 102 acts as a sensor substrate having a first protrusion 106 and a second protrusion 108 extending outward from a lateral surface 110 of the first substrate 102. A magnetic film 112 is disposed on the first protrusion 106. A conformal passivation film 118 covers the magnetic film 112. The first bonding element 126 is disposed on the second protrusion 108.

The second substrate 104 acts as a counter substrate having a recess 116 disposed within a front surface 120 and vertically aligned with the magnetic film 112. The magnetic film 112 is separated from a bottom surface 140 of the recess 116 of the second substrate 104 by a first gap 124. A second gap 122 is disposed between the lateral surface 110 and a front surface 120 of the second substrate 104. In some embodiments, the first gap 124 or the second gap 122 can be a sensing gap; in some other embodiments, the first gap 124 or the second gap 122 can be an actuation gap or a structural gap providing space for moving parts. In some embodiments, top surfaces of the first and second protrusions 106 and 108 are laterally aligned, in other words, coplanar at a front surface 130 of the first substrate 102. In some embodiment, the magnetic film 112, and/or the passivation film 118, extends downwardly to a top surface 150 vertically underlying the first bonding element 126 and/or within the recess 116. In other embodiment, the magnetic film 112, and/or the passivation film 118, may be located at a position vertically overlying the first bonding element 126. Notably, there is no additional magnetic film residue around corners of topography of the first substrate 102 such as corners 132 shown in FIG. 1.

In some embodiments, the MEMs device 100 may comprise a combination MEMS device comprising multiple MEMS devices. In such embodiments, the first gap 124 may be associated with a first MEMS device 134, such as a magnetometer. The second sensing gap 122 may be associated with a second MEMS device 136 that is different from the first MEMS device, such as an accelerometer, a gyroscope, or a pressure sensor. In various embodiments, the first and second substrates, 102 and 104, may comprise any type of semiconductor body (e.g., silicon, silicon germanium (SiGe), SOI, etc.) such as a semiconductor wafer or one or more die on a wafer, as well as any other type of semiconductor and/or epitaxial layers formed thereon and/or otherwise associated therewith. In some embodiments, the first substrate 102 can be a sensor wafer comprising movable MEMS structures. The second substrate 104 can be a CMOS wafer or a bulk silicon wafer with metal routings. In some embodiments, the magnetic film 112 can comprise metals, alloys, metal oxides, or metal nitrides. For example, the magnetic film 112 can comprise Ni, Fe, Cobalt, Permalloy (NiFe), Chromium, FeMn, NiMn, SiN, $SiO_2$, MgO, $Al_2O_3$, $Fe_3O_4$ or other applicable materials. In some embodiments, the first and second bonding elements 126 and 128 are a pair of bonding pads comprising materials selected from a group consisting of polymer, indium (In), gold (Au), tin (Sn), copper (Cu), aluminum (Al), germanium (Ge), and combinations thereof. For example, the first and second bonding elements 126 and 128 can be made of a pair of polymer pads, Al—Ge, Au—Au, or Cu—Cu for eutectic bonding.

Figure 2:
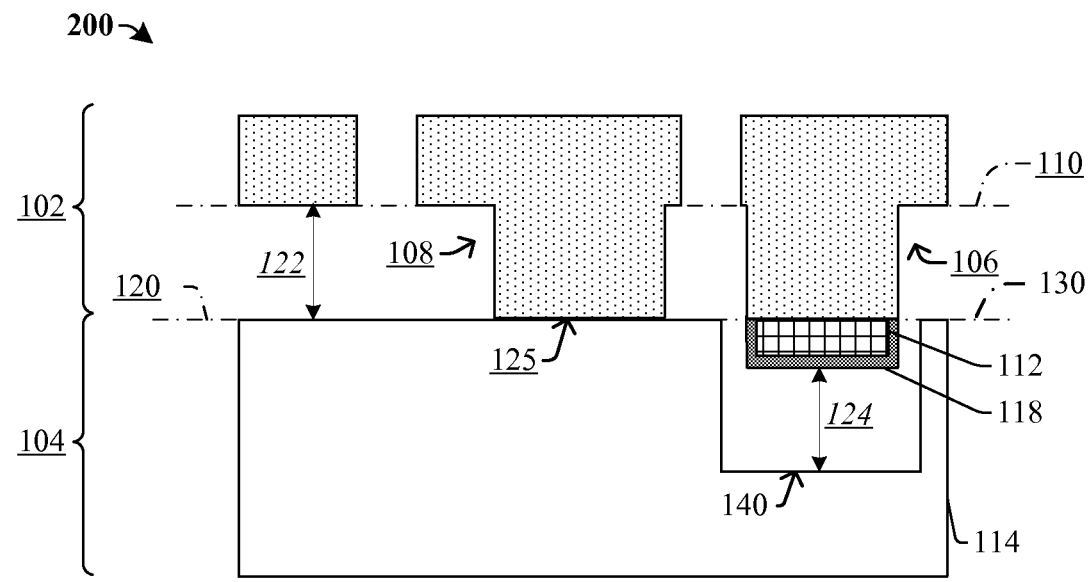

FIG. 2 illustrates a cross-sectional view of a MEMS device 200 according to some alternative embodiments. The MEMS device 200 comprises a first substrate 102 having a front surface 120 and a second substrate having a front surface 130 that is laterally aligned with the front surface 120 of the first substrate 102. The first substrate 102 is directly bonded to the second substrate 104 so that front surfaces 130 and 120 are abutting. In many embodiments, covalent Si—Si bonds are present at a bond interface 125 located between the front surfaces, 120 and 130. The first substrate 102 comprises a first protrusion 106 and a second protrusion 108 extending outward from a lateral surface 110 of the first substrate 102. The first protrusion 106 and the second protrusion 108 have top surfaces aligned with the front surfaces 120 and 130.

A magnetic film 112 and a passivation film 118 are disposed on the first protrusion 106. The magnetic film 112 is disposed between the passivation film 118 and the protrusion 106, such that the passivation film 118 covers the magnetic film 112. A recess 116 is disposed within the second substrate 104 vertically aligned with the magnetic film 112 and the passivation film 118. A first sensing gap 124 is located between the passivation film 118 and a bottom surface 140 of the recess 116. A second sensing gap 122 is located between the lateral surface 110 and the front surface 120 of the second substrate 104.

Figure 3:
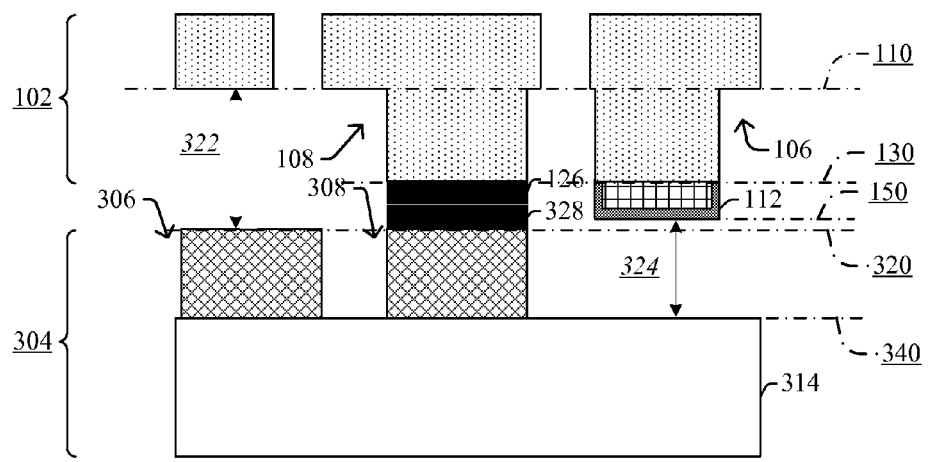

FIG. 3 illustrates a cross-sectional view of a MEMS device 300 according to some alternative embodiments. The MEMS device 300 comprises a first substrate 102 bonded to a second substrate 304. The first substrate 102 comprises a first protrusion 106 and a second protrusion 108 extending downwardly from a lateral surface 110 to a front surface 130 of the first substrate 102. The second substrate 304 comprises a semiconductor body 314 and a first protrusion 306 and a second protrusion 308 disposed on the semiconductor body 314. The first and second protrusions 306 and 308 extend upwardly from a lateral surface 340 to a front surface 320 of the second substrate 304. A first sensing gap 324 is located between a top surface 150 of a magnetic film 112 and the lateral surface 340 of the second substrate 304. A second sensing gap 322 is located between the front surface 320 of the second substrate and the lateral surface 110 of the first substrate 102. In some embodiments, the first and second protrusions 306 and 308 of the second substrate 304 may comprise silicon, silicon dioxide, or metal. In some embodiments, the first and second protrusions 306 and 308 may comprise conductive materials used for electrical sensing.

Figure 4:
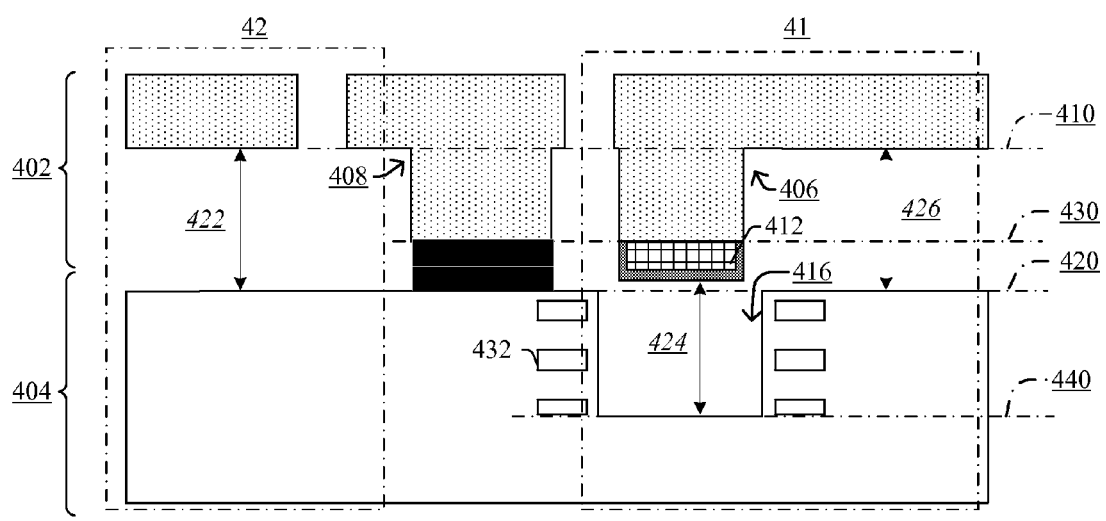

FIG. 4 illustrates a cross-sectional view of a MEMS device 400 according to some embodiments. The MEMS device 400 comprises a first MEMS device 41 and a second MEMS device 42. The first MEMS device 41 comprises a magnetometer having a magnetic film 412 disposed on a first protrusion 406 of a first substrate 402. The first protrusion 406 and a second protrusion 408 extend downwardly from a lateral surface 410 to a front surface 430 of the first substrate 402. Top surfaces of the first and second protrusions are aligned to the front surface 430 of the first substrate 402. The magnetometer has a first sensing gap 424 and a second sensing gap 426. The first sensing gap 424 is located between the magnetic film 412 and a lateral surface 440 of a second substrate 404 bonded to the first substrate 402. The second sensing gap 426 is located between the lateral surface 410 of the first substrate 402 and a front surface 420 of the second substrate 404.

The first and second sensing gaps, 424 and 426, are configured to change as a function of time. For example, the first sensing gap 424 may change (e.g., get larger or smaller) as an external stimuli varies. The first MEMS device 41 is configured to detect the changes in the first and/or second sensing gaps, 424 and/or 426, and to base upon the changes to measure a value of the external stimuli. For example, if the first MEMS device 41 comprises a magnetometer, a change in the first and/or second sensing gaps, 424 and/or 426, will correspond to a change in a measured magnetic field. It will be appreciated that changes in the first and second sensing gaps, 424 and 426, can be detected according to a wide range of sensing techniques.

For example, in some embodiments, an embedded conductive coil 432 is disposed in the second substrate around a recess 416 aligned with the magnetic film 412. In such embodiments, changes in the first sensing gap 424 may be used to perform inductive sensing or capacitive sensing. The embedded conductive coil 432 can be configured to generate magnetic field for self-test or compensation for the first MEMS device 41. In some other embodiments, an embedded piezo-resistor is disposed in the first substrate vertically aligned with the second sensing gap 426. In such embodiments, changes in the second sensing gap 426 may be used to perform piezo-resistive sensing or capacitive sensing. In some embodiments, the first and second sensing gaps 424 and 426 have values that vary at related rates.

In various embodiments, the second MEMS device 42 may comprises an accelerometer, a gyroscope, or a pressure sensor. In such embodiments, the second MEMS device 42 has a third sensing gap 422 located between the lateral surface 410 of the first substrate and a front surface 420 of the second substrate 404. The third sensing gap 422 may be configured to change as a function of time. In some embodiments, the third sensing gap 422 is configured to perform capacitive sensing. In some embodiments, the third sensing gap 422 has a value that varies at a rate that is independent of the rates of which the first and second sensing gaps 424 and 426 vary.

Figure 5:
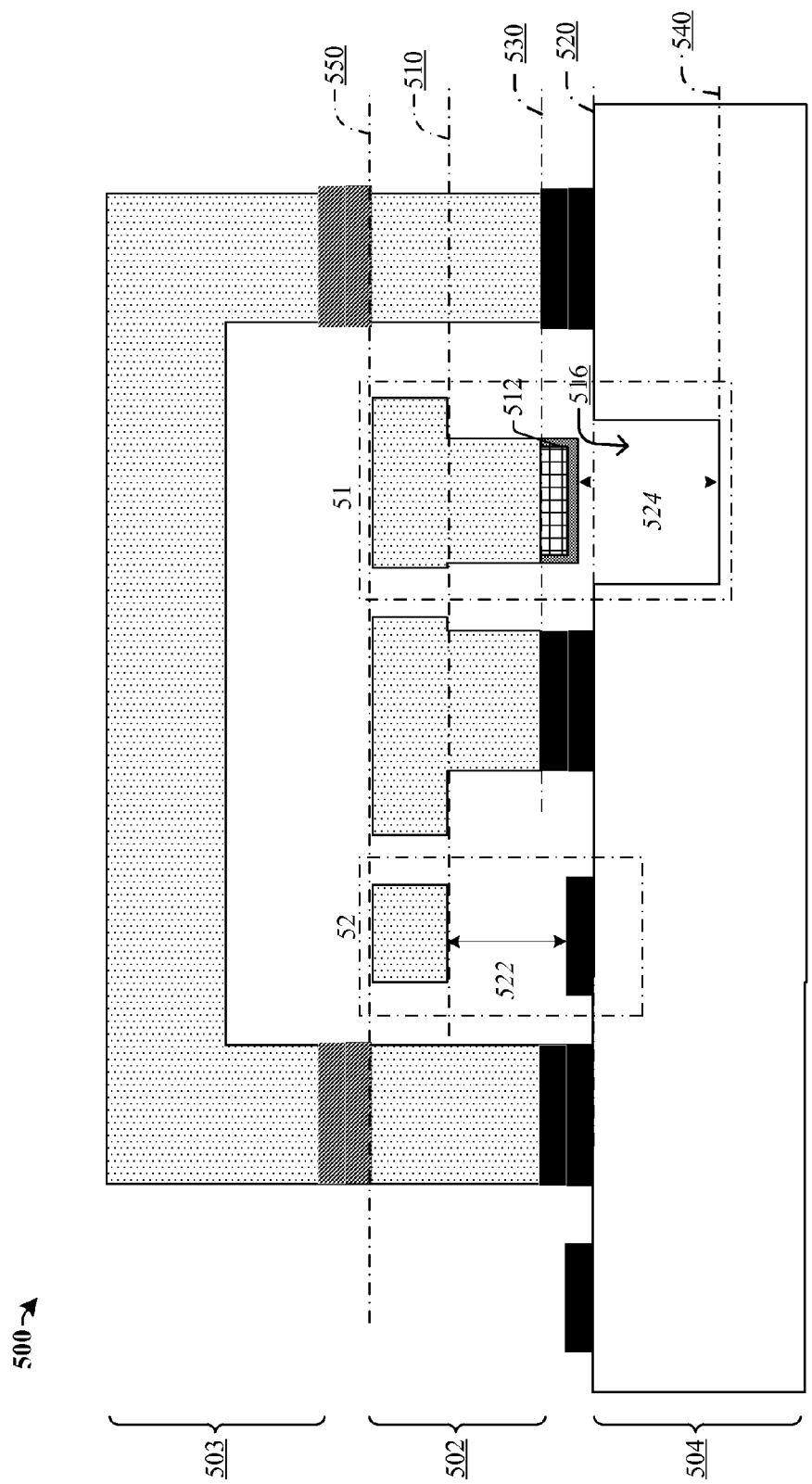

FIG. 5 illustrates a cross-sectional view of a MEMS device 500 according to some embodiments. The MEMS device 500 comprises multiple different MEMES sensors, 51 and 52. A magnetic film 512 is disposed on a front surface 530 of a first substrate 502. A first sensing gap 524 is disposed between the magnetic film 512 and a bottom surface 540 of a recess 516. The recess 516 is disposed at a position that is vertically aligned with the magnetic film 512 within a second substrate 504.

A front surface 520 of the second substrate 504 is bonded to a front surface 530 of the first substrate 502. A back surface 550 of the first substrate 502 is bonded to a third substrate 503. In some embodiments, the third substrate 503 acts as a capping substrate configured to hermetically enclose a cavity between the third substrate 503 and the first and second substrate 502 and 504. In some embodiments, the first substrate 502 is bonded to the third substrate 503 before being bonded to the second substrate 504. The first substrate 502 may be bonded to the third substrate 503 by a bonding material different from a bonding material that bonds the first substrate 502 to the second substrate 504. In various embodiments, the first, second and third substrates 502, 504 and 506 may comprise any type of semiconductor body such as a semiconductor wafer or one or more die on a wafer, as well as any other type of semiconductor and/or epitaxial layers formed thereon and/or otherwise associated therewith. The second substrate may comprise CMOS circuits arranged over a silicon bulk wafer or a handle wafer and may be separated from the handle wafer by a buried oxide layer. The MEMS device 500 may be formed in a wafer stacks and diced into multiple dies and packaged in subsequent processes.

Figure 6:
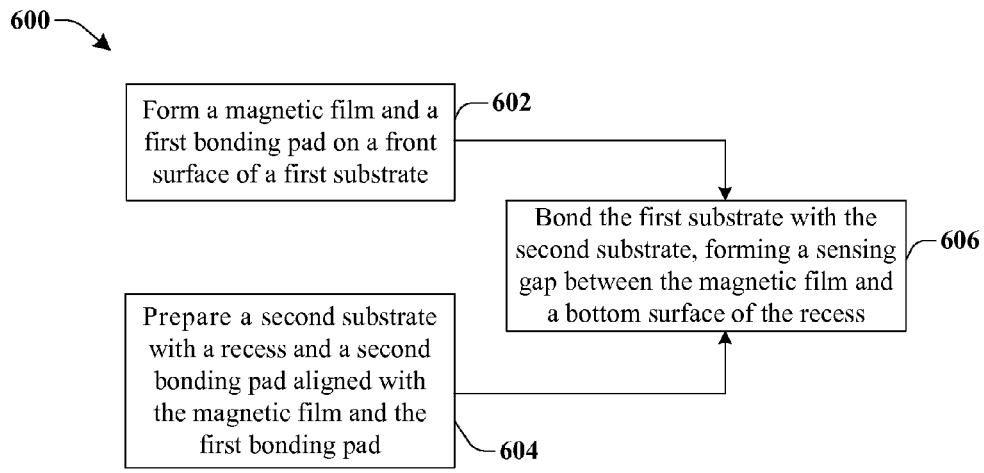
FIG. 6 illustrates a flow diagram of some embodiments of a method of forming a MEMS device having a magnetic film disposed on a substrate.

FIG. 6 illustrates a flow diagram of a method 600 of forming a MEMS device having a magnetic film disposed on a substrate according to some embodiments.

While the disclosed methods (e.g., methods 600 and 700) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a magnetic film and a first bonding pad are formed at laterally separated positions on a front surface of a first substrate. The front surface of the first substrate is a planar surface.

At 604, a second substrate with a recess and a second bonding pad is prepared.

At 606, the second substrate is bonded to the first substrate. The first and second substrates are bonded together so that the recess in the second substrate is vertically aligned to the magnetic film, and so that the second bonding pad is vertically aligned to the first bonding pad. A sensing gap is formed between the magnetic film and a bottom surface of the recess, as a result of the bonding.

Figure 7:
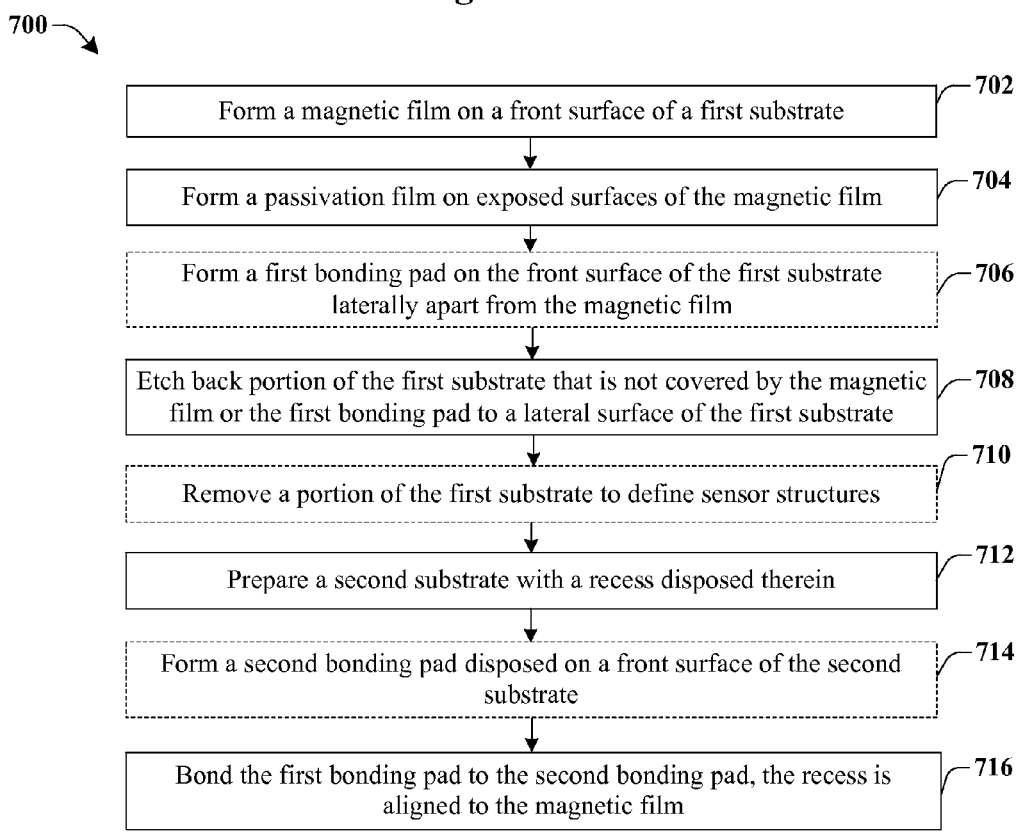
FIG. 7 illustrates a flow diagram of some alternative embodiments of a method of forming a MEMS device having a magnetic film disposed on a substrate.

FIG. 7 illustrates a flow diagram a method 700 of forming a MEMS device having a magnetic film disposed on a substrate according to some alternative embodiments.

At 702, a magnetic film is formed on a front surface of a first substrate.

At 704, a passivation film is formed on exposed surfaces of the magnetic film.

At 706, a first bonding pad may be formed on the front surface of the first substrate, in some embodiments.

At 708, a portion of the first substrate that is not covered by the magnetic film or the first bonding pad is etched back to a lateral surface of the first substrate. The etch back process causes the magnetic film and the passivation film to be disposed onto a first protrusion extending outward from the lateral surface, and the bonding pad to be disposed onto a second protrusion extending outward from the lateral surface.

At 710, a portion of the first substrate may be removed to define sensor structures of different MEMS devices, in some embodiments.

At 712, a second substrate is prepared with a recess disposed therein.

At 714, a second bonding pad may be formed on a front surface of the second substrate, in some embodiments.

At 716, the front surface of the first substrate is bonded to the front surface of the second substrate, so that the recess is aligned to the magnetic film.

FIGS. 8-15B illustrate some cross-sectional views showing a method of forming a MEMS device having a magnetic film disposed on a substrate according to some embodiments. Although FIGS. 8-15B are described in relation to the method 700, it will be appreciated that the structures disclosed in FIGS. 8-15B are not limited to the method 700, but instead may stand alone as structures independent of the method 700. Similarly, although the method 700 is described in relation to FIGS. 8-15B, it will be appreciated that the method 700 is not limited to the structures disclosed in FIGS. 8-15B, but instead may stand alone independent of the structures disclosed in FIGS. 8-15B.

Figure 8:
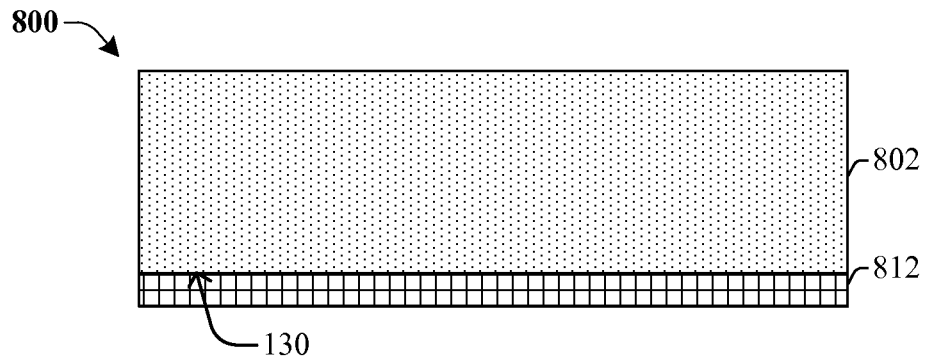
Figure 9:
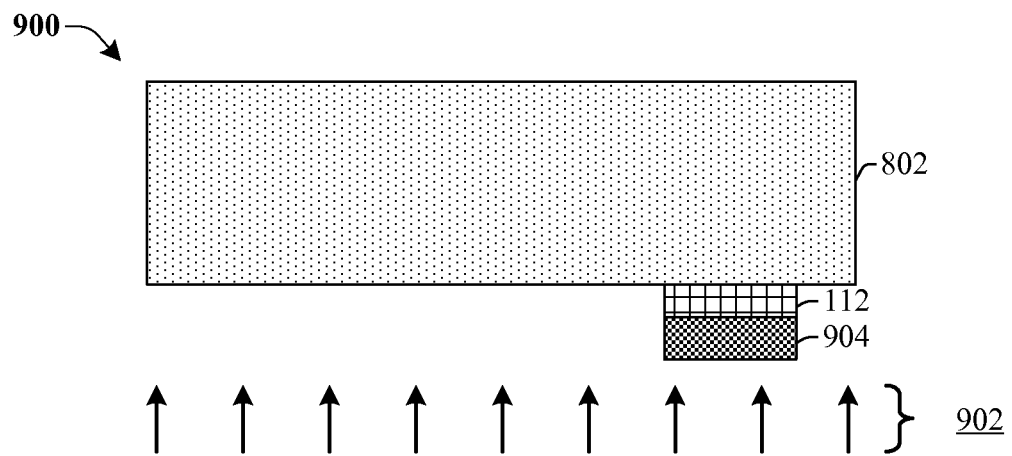

FIGS. 8-9 illustrate some embodiments of cross-sectional views, 800 and 900, corresponding to act 702.

As shown in cross-sectional view 800, a magnetic material layer 812 is formed on a front surface 130 of a first substrate 802. In some embodiments, the magnetic material layer 812 can be deposited using sputter, Ion-beam, E-beam, or chemical mechanical deposition (CVD). In some embodiments, the magnetic material layer 812 comprises metals or alloys, metal oxides or metal nitrides. For example, the magnetic material layer 812 may comprise Ni, Fe, Cobalt, Permalloy (NiFe), Chromium, FeMn, NiMn, SiN, $SiO_2$, MgO, $Al_2O_3$, $Fe_3O_4$ or other applicable materials.

As shown in cross-sectional view 900, the magnetic material layer 812 is patterned to form a magnetic film 112. A masking layer 904 is selectively formed over the magnetic material layer 812 at positions that define the magnetic film.

The magnetic material layer 812 is then exposed to a first etchant 902. The first etchant 902 is configured to remove a portion of the magnetic material layer 812 from areas not covered by the masking layer 904, resulting in the magnetic film 112. In some embodiments, the first etchant 902 is a dry etch.

In various embodiments, the magnetic film 112 can be a single layer of magnetic material or a stack of several layers. The magnetic film 112 can be a single magnetic element of magnetic material or an array of several magnetic elements. The magnetic film 112 can have a shape of a square or a rectangular with a dimension in a range of from about 0.1 μm to about 1 mm per side. The magnetic film 112 can have a thickness in a range of from about 1 nm to about 10 μm. Other applicable materials, structures, dimensions are also amenable for the magnetic film 112.

Figure 10:
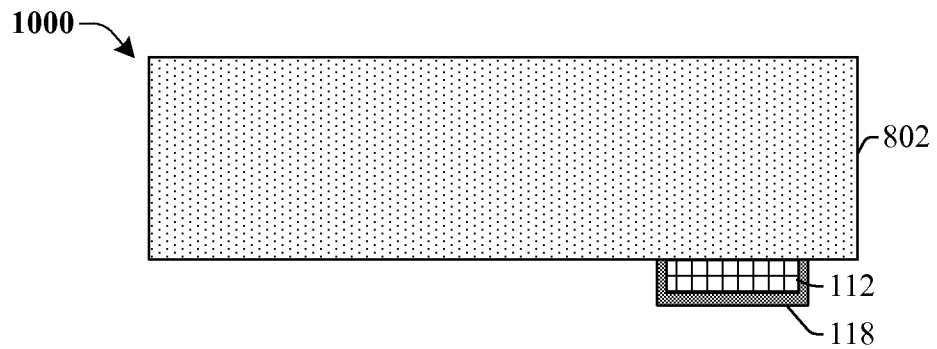

FIG. 10 illustrates some embodiments of a cross-sectional views 1000 corresponding to act 704.

As shown in cross-sectional view 1000, a passivation film 118 is deposited and patterned on exposed surfaces of the magnetic film 112. The passivation film 118 is configured to protect the magnetic film 112 from the ambient environment. The passivation film 118, for example, can be made of silicon nitride, having a thickness in a range of from about 0.1 μm to about 2 μm.

Figure 11:
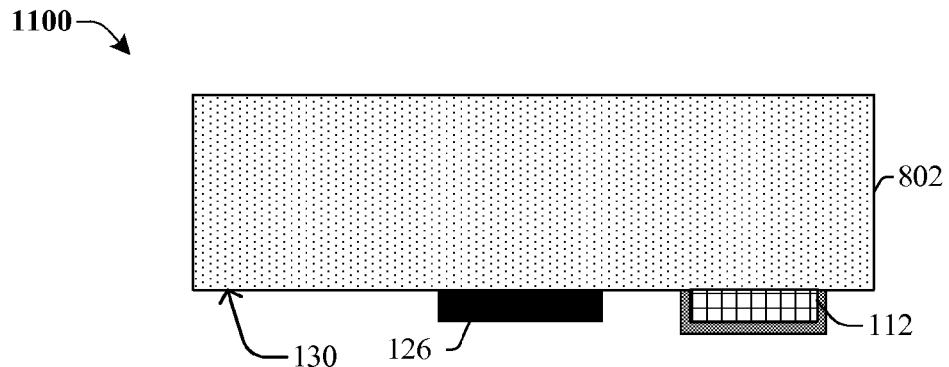

FIG. 11 illustrates some embodiments of a cross-sectional views 1100 corresponding to act 706.

As shown in cross-sectional view 1100, a first bonding pad 126 is formed on the front surface 130 of the first substrate 802. The first bonding pad 126 may comprise materials selected from a group consisting of polymer, indium (In), gold (Au), tin (Sn), copper (Cu), aluminum (Al), germanium (Ge) and combinations thereof.

Figure 12:
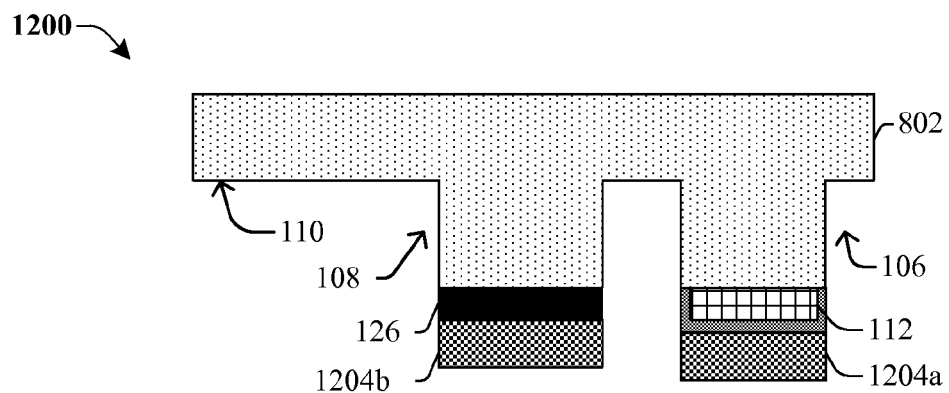

FIG. 12 illustrates some embodiments of a cross-sectional view 1200 corresponding to act 708.

As shown in cross-sectional view 1200, a portion of the first substrate 802 that is not covered by the magnetic film 112 or the first bonding pad 126 is etched back to a lateral surface 110 of the first substrate 802 by a second etchant 1202. The second etchant 1202 results in a first protrusion 106 and a second protrusion 108 extending outward from the lateral surface 110. In some embodiments, the second etch 1202 is a dry etch. A mask layer 1204 is formed on the magnetic film 112 and the first bonding pad 126.

Figure 13:
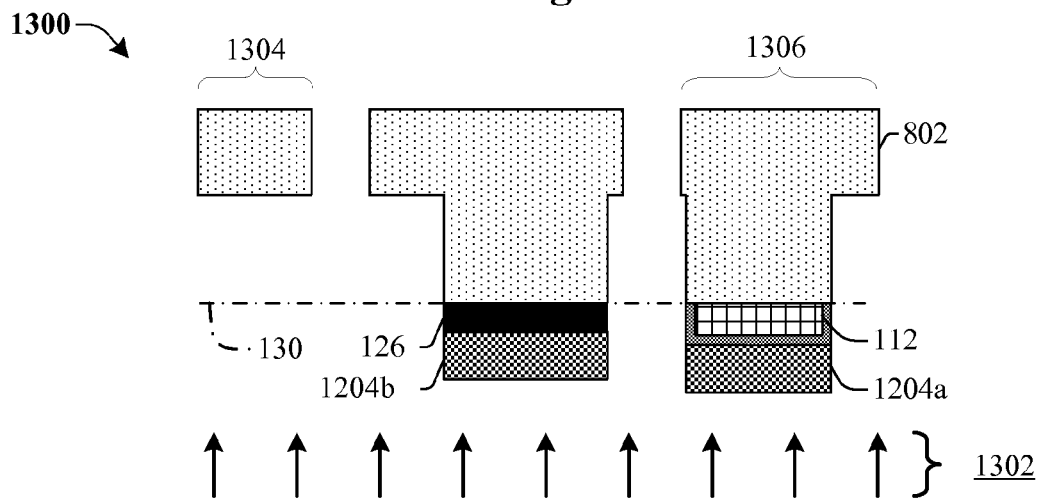

FIG. 13 illustrates some embodiments of a cross-sectional view 1300 corresponding to act 710.

As shown in cross-sectional view 1300, a portion of the first substrate 802 is removed to define separate MEMS sensor structures, 1304 and 1306, by a third etchant 1302. It will be appreciated that the MEMS sensor structures, 1304 and 1306, are not limited by what is shown in cross-sectional view 1300, but that other applicable sensor structures are amenable.

FIGS. 14A-14B illustrate some embodiments of cross-sectional views, 1400a and 1400b, corresponding to acts 712-714.

As shown in cross-sectional view 1400a, a second substrate 104 is prepared with a recess 116 disposed therein. In some embodiments, a second bonding pad 128 is formed on a front surface 120 of the second substrate 104.

As shown in cross-sectional view 1400b, a second substrate 304 is prepared with a first protrusion 306 and a second protrusion 308 disposed on a semiconductor body 314. The first and second protrusions 306 and 308 extend upwardly from a lateral surface 340 to a front surface 320 of the second substrate 304. In some embodiments, a second bonding pad 128 is formed on a front surface 120 of the second protrusion 308. In some other embodiments, the second protrusion 308 can be applied as a second bonding pad.

FIGS. 15A-15B illustrate some embodiments of cross-sectional views, 1500a and 1500b, corresponding to act 716.

As shown in cross-sectional view 1500a, the front surface 130 of the first substrate 802 is bonded to the front surface 120 of the second substrate 104 through the first and second bonding pads 126 and 128. The recess 116 is aligned to the magnetic film 112.

As shown in cross-sectional view 1500b, the second substrate 304 is bonded to the first substrate 802. In some embodiments, the second protrusion 308 of the second substrate 304 is bonded to the second protrusion 108 of the first substrate 802 through the first and second bonding pads 126 and 128.

Therefore, the present disclosure relates to a MEMS device having a MEMS device having a magnetic film disposed on a first substrate, and an associated method of formation. The magnetic film is disposed on a planar front surface of the first substrate such that depositing and patterning processes of the magnetic film is improved. A sensing gap of a MEMS device associated with the magnetic film is located between the magnetic film and a recessed lateral surface of a second substrate. The second substrate is bonded to the first substrate at front surfaces of the first and second substrate.

In some embodiments, the present disclosure relates to a MEMS device. The MEMS device comprises a first substrate. The first substrate has a first protrusion and a second protrusion extending outward from a lateral surface of the first substrate. A magnetic film is disposed on the first protrusion. A second substrate is bonded to the second protrusion. The magnetic film is separated from the second substrate by a first sensing gap.

In other embodiments, the present disclosure relates to a MEMS device. The MEMS device comprises a first substrate bonded to a second substrate. The first substrate has a first protrusion and a second protrusion extending outward from a lateral surface of the first substrate. A magnetic film is disposed on the first protrusion. The second substrate comprises a recess disposed within a front surface of the second substrate at a location vertically aligned with the magnetic film. First and second bonding elements are disposed on the second protrusion of the first substrate and the front surface of the second substrate, respectively. The bonding elements are configured to bond the first substrate to the second substrate so that a first sensing gap associated with a first MEMS device is disposed between the magnetic film and the recess and a second sensing gap associated with a second MEMS device is disposed between the lateral surface and the front surface of the second substrate.

In yet other embodiments, the present disclosure relates to a method of forming a magnetic sensor. The method comprises forming a magnetic film on a front surface of a first substrate. The method further comprises forming a recess within a front surface of the second substrate at a first location corresponding to the magnetic film. The method further comprises bonding the first substrate to the second substrate and forming a first sensing gap between a bottom surface of the recess and the magnetic film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A MEMS device, comprising:
a first substrate having a first protrusion and a second protrusion extending outward from a lateral surface of the first substrate;
a magnetic film disposed on the first protrusion; and
a second substrate bonded to the second protrusion;
a second sensing gap located between the lateral surface of the first substrate and a front surface of the second substrate;
wherein the magnetic film is separated from the second substrate by a first sensing gap;
wherein the first sensing gap is associated with a first MEMS device comprising a magnetic field sensor; and
wherein the second sensing gap is associated with a second MEMS device that is different than the first MEMS device.

2. The MEMS device of claim 1, wherein the second substrate comprises:
a recess disposed within a front surface of the second substrate, at a position vertically aligned with the magnetic film.

3. The MEMS device of claim 1, wherein the second substrate comprises:
a semiconductor body; and
one or more protrusions disposed on the semiconductor body.

4. The MEMS device of claim 1, wherein top surfaces of the first and second protrusions are laterally aligned with a front surface of the first substrate.

5. The MEMS device of claim 1, wherein the first MEMS device is magnetometer and the second MEMS device is an accelerometer, a gyroscope or a pressure sensor.

6. The MEMS device of claim 1, wherein the second sensing gap is isolated from the first sensing gap.

7. The MEMS device of claim 1, wherein the front surface of the second substrate is a planar surface extending laterally to be bonded to the second protrusion of the first substrate.

8. The MEMS device of claim 1, wherein the magnetic film extends to a top surface underlying the front surface of the second substrate.

9. The MEMS device of claim 1, wherein the second sensing gap is isolated from the first sensing gap by the second protrusion.

10. The MEMS device of claim 1, further comprising:
a first bonding element disposed on the second protrusion; and
a second bonding element disposed on a top surface of the second substrate at a location vertically aligned with the first bonding element;
wherein the first and second bonding elements comprise materials selected from a group consisting of polymer, indium, gold, tin, copper, aluminum, germanium and combinations thereof;
wherein the first and second bonding elements are configured to bond the first and second substrates.

11. The MEMS device of claim 10, wherein the magnetic film or a passivation film covering the magnetic film extends to a top surface underlying the second bonding element.

12. A MEMS device, comprising:
a first substrate having a first protrusion and a second protrusion extending outward from a lateral surface of the first substrate;
a magnetic film disposed on the first protrusion;
a second substrate comprising a recess disposed within a front surface of the second substrate at a location vertically aligned with the magnetic film; and
first and second bonding elements disposed on the second protrusion of the first substrate and the front surface of the second substrate, respectively, wherein the first and second bonding elements are configured to bond the first substrate to the second substrate so that a first sensing gap associated with a first MEMS device is disposed between the magnetic film and the recess and a second sensing gap associated with a second MEMS device is disposed between the lateral surface and the front surface of the second substrate.

13. The MEMS device of claim 12, further comprising:
a third sensing gap associated with the first MEMS device, which is disposed between the lateral surface and the front surface of the second substrate;
wherein the first and third sensing gaps have values that vary at related rates that are independent to a rate of which the second sensing gap varies.

14. The MEMS device of claim 13,
wherein an embedded conductive coil is disposed in the second substrate around the recess and the first sensing gap is configured to perform inductive sensing; or
wherein the third sensing gap is configured to perform capacitive sensing.

15. The MEMS device of claim 12, further comprising:
a capping substrate bonded on a back surface of the first substrate, wherein the capping substrate encloses a cavity disposed between the capping substrate and the second substrate.

16. A method of forming a magnetic sensor, comprising:
forming a magnetic film on a front surface of a first substrate;
forming a recess within a front surface of a second substrate at a first location corresponding to the magnetic film;
bonding the first substrate to the second substrate, forming a first sensing gap between a bottom surface of the recess and the magnetic film;
wherein forming the magnetic film comprises:
forming a magnetic material layer over the first substrate using a sputter, Ion-beam, E-beam, or chemical mechanical deposition (CVD) process;
covering a portion of the magnetic material layer with a masking layer at a position covering the magnetic film; and
removing a portion of the magnetic material layer not covered by the masking layer using a dry etching process.

17. The method of claim 16, further comprising:
etching back a portion of the first substrate that is not covered by the magnetic film to a lateral surface of the first substrate before bonding the first substrate to the second substrate;
wherein a second gap is formed between the lateral surface of the first substrate and the front surface of the second substrate after the bonding.

18. The method of claim 16, further comprising:
forming a first bonding pad at a first position on the front surface of the first substrate; and
forming a second bonding pad on the front surface of the second substrate at a second position corresponding to the first position of the first bonding pad, wherein the first substrate is bonded to the second substrate by affixing the first bonding pad to the second bonding pad.

19. The method of claim 18, wherein the magnetic film and the first bonding pad are laterally aligned along the front surface of the first substrate.

20. The method of claim 16, further comprising:
forming a conformal passivation film on exposed surfaces of the magnetic film to protect the magnetic film from an ambient environment.

* * * * *